United States Patent
Huang et al.

(10) Patent No.: US 9,620,628 B1
(45) Date of Patent: Apr. 11, 2017

(54) METHODS OF FORMING CONTACT FEATURE

(71) Applicant: Taiwan Semiconductor Manufacturing Co., Ltd., Hsin-Chu (TW)

(72) Inventors: Gin-Chen Huang, New Taipei (TW); Hui-Chi Huang, Zhubei (TW); Yung-Cheng Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/204,848

(22) Filed: Jul. 7, 2016

(51) Int. Cl.
| | |
|---|---|
| *H01L 29/66* | (2006.01) |
| *H01L 29/06* | (2006.01) |
| *H01L 21/28* | (2006.01) |
| *H01L 23/522* | (2006.01) |
| *H01L 21/311* | (2006.01) |
| *H01L 21/02* | (2006.01) |

(52) U.S. Cl.
CPC ........ *H01L 29/66795* (2013.01); *H01L 21/28* (2013.01); *H01L 21/31116* (2013.01); *H01L 23/5226* (2013.01); *H01L 29/0673* (2013.01); *H01L 29/6653* (2013.01); *H01L 29/66545* (2013.01); *H01L 29/66606* (2013.01); *H01L 21/0217* (2013.01); *H01L 21/02167* (2013.01)

(58) Field of Classification Search
CPC ........................... H01L 29/66795; H01L 21/28
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2012/0052641 A1* | 3/2012 | Lee .................. H01L 21/28088 438/270 |
| 2012/0088345 A1* | 4/2012 | Chen ................ H01L 21/28518 438/301 |
| 2013/0285153 A1 | 10/2013 | Lee et al. |
| 2014/0183600 A1 | 7/2014 | Huang et al. |
| 2014/0264590 A1 | 9/2014 | Yu et al. |

(Continued)

*Primary Examiner* — Scott B Geyer
*Assistant Examiner* — S. M. S Imtiaz
(74) *Attorney, Agent, or Firm* — Haynes and Boone, LLP

(57) ABSTRACT

A method to fabricate a semiconductor device includes forming a semiconductor fin on a substrate; forming a dummy gate material layer over the semiconductor fin; forming a contact hole in the dummy gate material layer; forming a source/drain feature in the contact hole; forming a contact feature on the source/drain feature within the contact hole; and replacing a dummy gate that is formed of the dummy gate material layer with a metal gate.

20 Claims, 21 Drawing Sheets

(56) References Cited

U.S. PATENT DOCUMENTS

2014/0264592 A1    9/2014  Oxland et al.
2015/0348966 A1*  12/2015  Zhao .................. H01L 27/0886
                                              257/401
2016/0308065 A1*  10/2016  Masuoka .......... H01L 21/82348

* cited by examiner

METHODS OF FORMING CONTACT FEATURE

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Integrated circuits include several types of components, particularly transistors. One type of transistor is a Metal Oxide Semiconductor Field Effect Transistor (MOSFET). MOSFET devices include a gate structure on top of a semiconductor substrate. Both sides of the gate structure are then doped to form source and drain regions. A channel is formed between the source and drain regions beneath the gate. Based on the voltage bias applied to the gate, electric current may either be allowed to flow through the channel or be inhibited from doing so.

In some cases, the channel may be formed using a fin structure. The fin structure extends out of the substrate and runs perpendicular to the gate structure formed on the substrate and fin structures. Doped regions, such as source and drain regions are formed in the fin structure on both sides of the gate structure. To connect the transistor to other components, a conductive contact connects to the source or drain regions. Although existing IC devices and methods of fabricating a conductive contact for devices with a fin structure have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
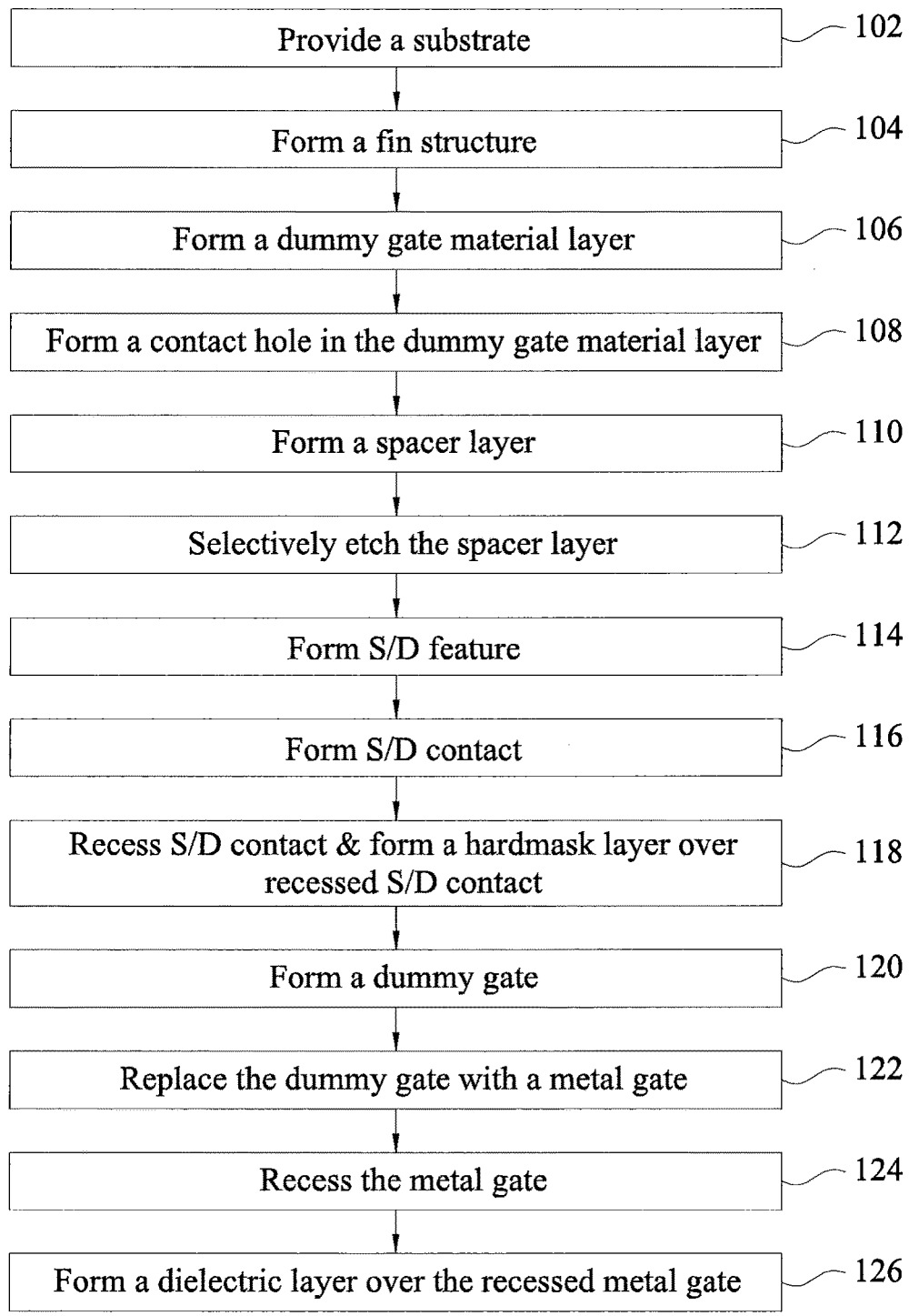
FIG. 1 depicts a method of fabricating a semiconductor device in accordance with various embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 is a flowchart of a method 100 of fabricating a semiconductor device 200 that includes a fin structure according to various aspects of the present disclosure in one or more embodiments. The method 100 is described with reference to FIG. 1 and in conjunction with FIGS. 2A, 2B, 2C, 2D, 2E, 2F, 2G, 2H, 2I, 2J, 2K, 2L, 2M, 2N, 2O, 2P, 2Q, and 2R. In some embodiments, the semiconductor device 200 fabricated according to the disclosed method 100 may be an element of an integrated circuit device such as, for example, a memory device. Method 100 may be used to fabricate plural fin structures, plural gate features over a single fin structure, and/or plural gate features over plural fin structures while remaining within the scope of the present disclosure. It is understood that additional steps can be provided before, during, and/or after the method 100, and some of the steps described can be replaced, eliminated, and/or moved around for additional embodiments of the method 100.

Figure 2A:
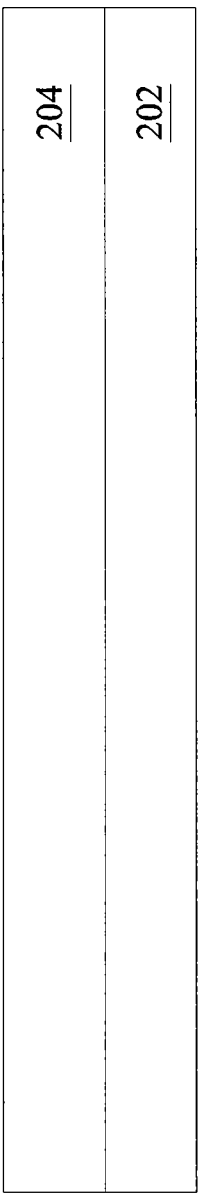
FIGS. 2A, 2B, 2C, 2D, 2E, 2F, 2G, 2H, 2I, 2J, 2K, 2L, 2M, 2N, 2O, 2P, 2Q, and 2R depict cross-sectional views of a semiconductor device fabricated by the method of FIG. 1 in accordance with various embodiments.

Referring to FIGS. 1 and 2A, method 100 begins at operation 102 with providing a substrate 202 having a doped region 204. In some embodiments, the doped region 204 may be an n-well and/or a p-well. In the following discussion, the doped region 204 may be illustrated as an n-well while the doped region 204 may include a p-well and still remain within the scope of the present disclosure.

The substrate 202 is a semiconductor substrate, such as a semiconductor wafer. The substrate 202 may be made of a semiconductor material such as silicon. In some examples, other materials such as germanium and/or III-V compound semiconductor materials may be used for the substrate 202. In the illustrated embodiment of FIG. 2A, the n-well 204 is a portion of the semiconductor substrate 202 that is doped with n-type dopants such as phosphorous and arsenic. As an example, one or more p-type field effect transistor (pFET) is to be formed over n-well 204. In the alternative embodiments in which the doped region 204 includes a p-well, a p-well may be alternatively formed thereon, such as when one or more n-type field effect transistor (nFET) is to be formed over the p-well 204.

Figure 2B:
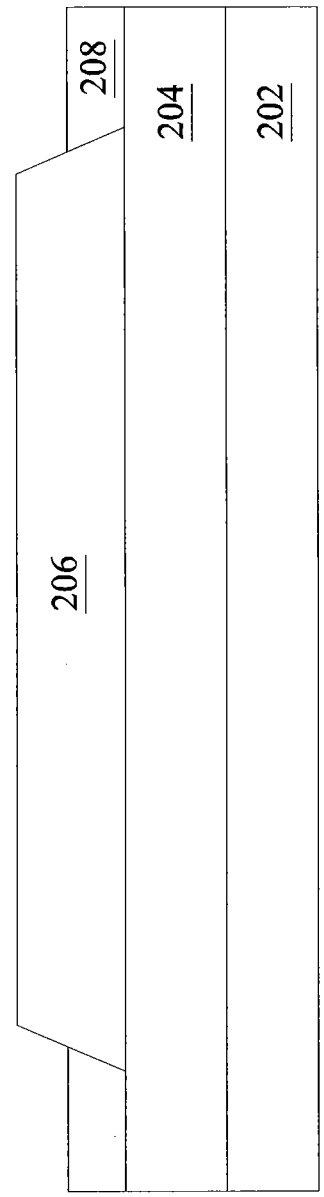

Referring to FIGS. 1 and 2B, the method 100 proceeds to operation 104 with forming a fin structure 206 on the substrate 202. Generally, the fin structure 206 is a narrow fin that extends from the substrate 202 including n-well 204. In that regard, as integrated circuit devices have continued to be scaled down the average feature sizes have become increasingly small. Here, fin structure 206 is a narrow fin having a width of about 5 nanometers to about 10 nanometers.

In some embodiments, the fin structure 206 is surrounded by an isolation structure, such as shallow trench isolation (STI) structure 208 as illustrated in FIG. 2B. The STI structure 208 includes one or more dielectric material feature that electrically isolates fin structure 206 from other fin structures and/or other components. In some embodiments, the STI structure is formed by a procedure that includes patterning the substrate to form trenches therein; filling the trenches with one or more dielectric material; and performing a polishing process (such as chemical mechanical polishing or CMP). The fin structure 206 may be formed in a variety of ways. In some embodiments, the fin structure 206 may be formed by a procedure having an epitaxial growth process. In furtherance of the embodiments, fin structure 206 is formed in the substrate; and a semiconductor material is epitaxially grown on the substrate, thereby forming fin-like active region 206. In some other embodiments, the fin structure 206 is formed by a procedure that includes etching the STI. First, STI structures 208 are formed in the substrate; and thereafter, an etching process is applied to selectively etch the STI, thereby fin-like active region is formed since the STI is recessed by the etching.

Figure 2C:
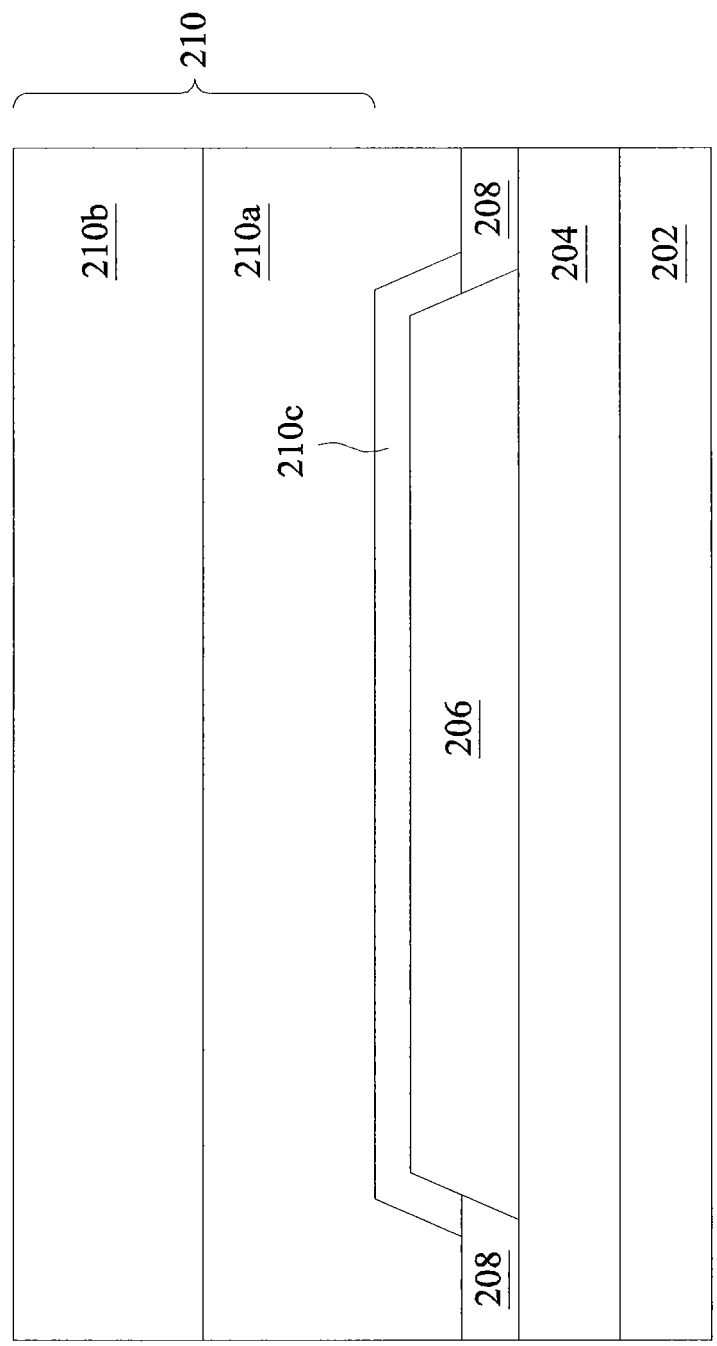

Referring to FIGS. 1 and 2C, the method 100 proceeds to operation 106 with forming a dummy gate material layer 210 over the fin structure 206. In some embodiments, the dummy gate material layer 210 may include one or more layers. For example, in the illustrated embodiment of FIG. 2C, the dummy gate material layer 210 includes layer 210a, 210b, and 210c, whereby the layer 210a may be made of a material such as polysilicon, the layer 210b may be a hardmask layer (e.g., a silicon nitride layer, a silicon oxide layer, a silicon carbide layer, a silicon oxynitride layer, or a combination hereof), and the layer 210c may be a dielectric layer (e.g., a silicon oxide layer) that wraps around the fin structure 206. Continuing with the above example, the forming of the polysilicon layer 210a may include one or more of the following processes: depositing a dummy oxide layer (e.g., 210c) over the fin structure 206, depositing the polysilicon layer (e.g., 210a) over the dummy oxide layer, depositing an etch stop layer over the polysilicon layer, depositing another polysilicon layer over the etch stop layer, polishing the layer(s) (the polysilicon layer over the etch stop layer) to the etch stop layer (e.g., a CMP process), and depositing a hardmask layer (e.g., 210b) over the polished layer(s).

Figure 2D:
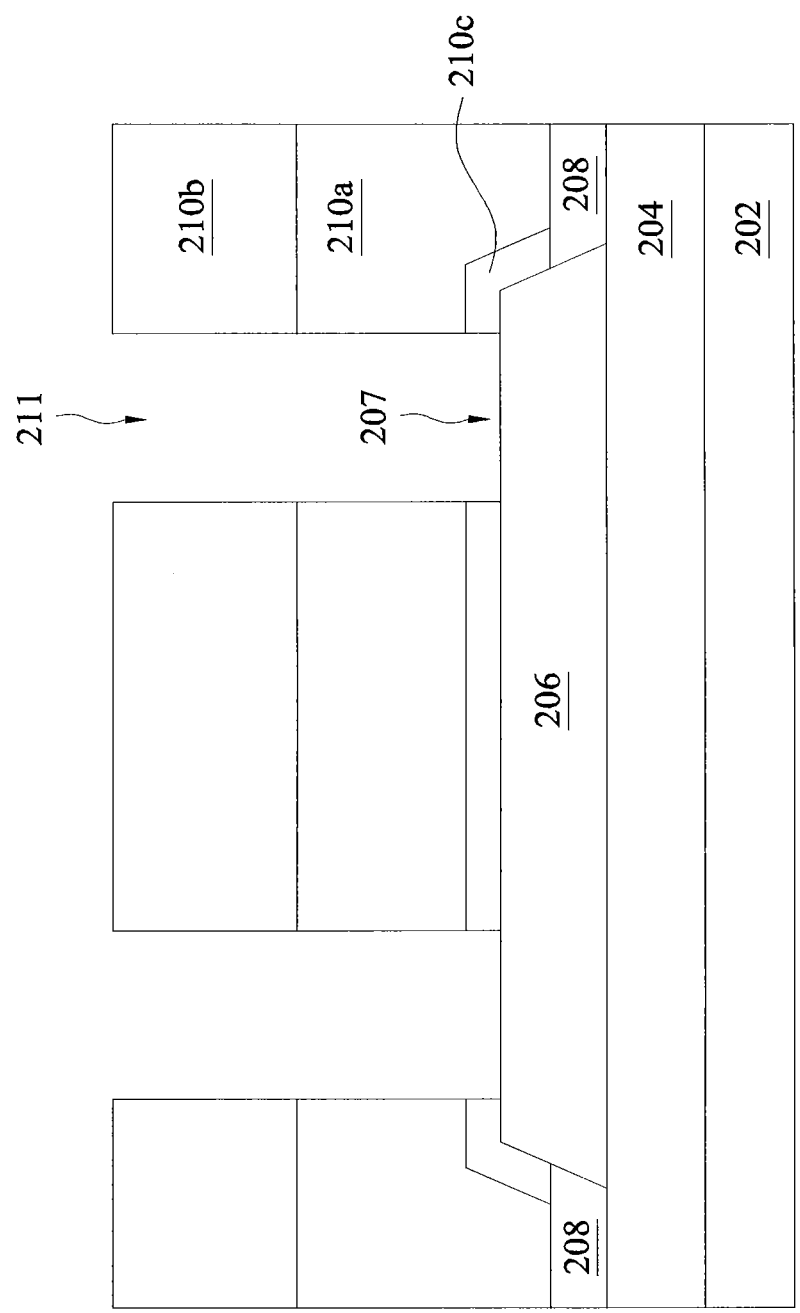

Referring to FIGS. 1 and 2D, the method 100 proceeds to operation 108 with forming a contact hole 211 (or contact holes) in the dummy gate material layer 210. In some embodiments, the forming of the contact hole 211 may include one or more of the following processes: forming one or more patterned mask layers over the dummy gate material layer 210, transferring a pattern through the patterned mask layer to the dummy gate material layer 210 through an etching process (e.g., a dry and/or wet etching process), and cleaning residues (if any). In the current embodiment, the contact hole 211 may be formed so as to expose a portion of top surface 207 of the fin structure 206. Such an exposed surface 207 may be later used to form a source/drain (S/D) feature of the semiconductor device 200. And in some additional or alternative embodiments, the forming of the contact hole 211 may be later used to form a self-aligned gate feature of the semiconductor device 200, which will be discussed below.

Figure 2E:
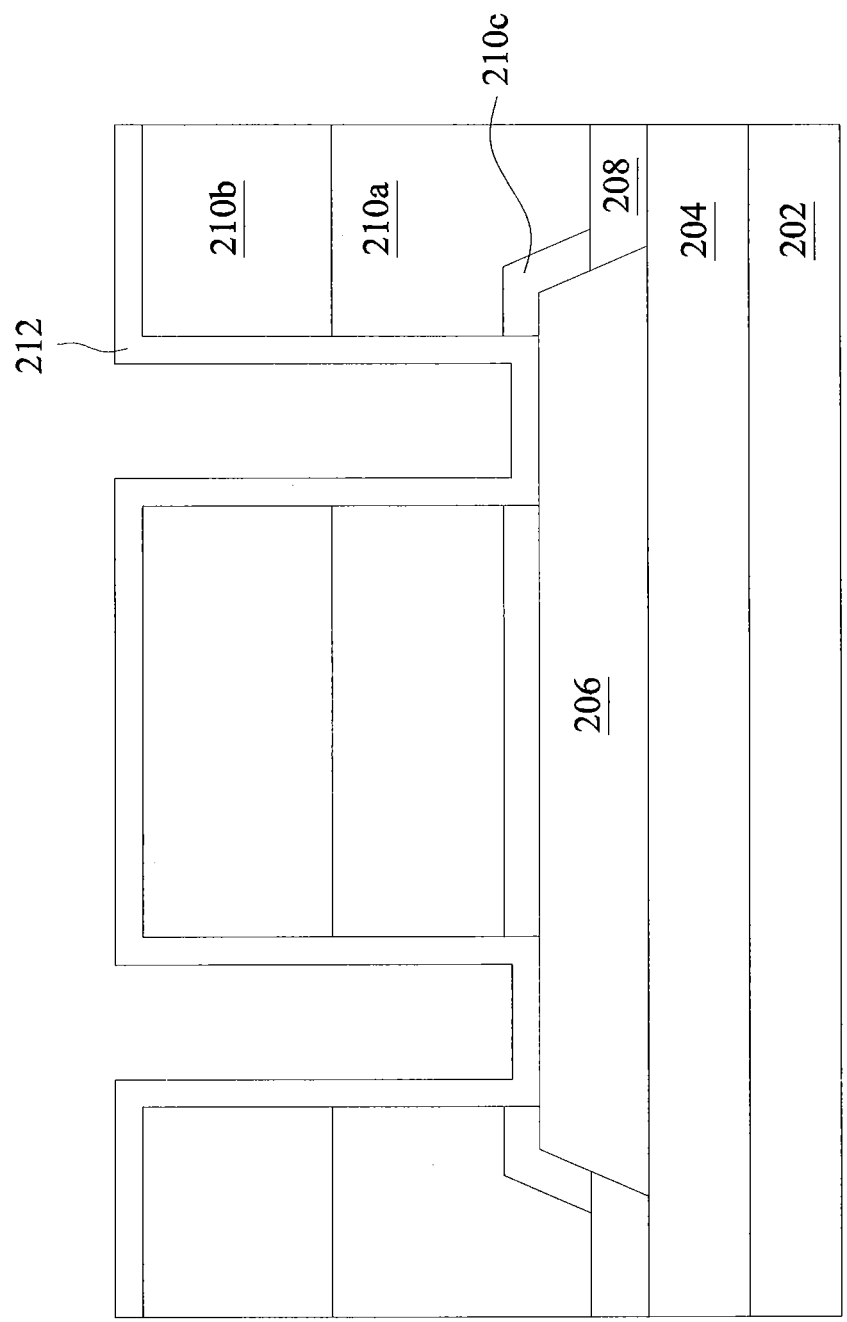

Referring to FIGS. 1 and 2E, the method 100 proceeds to operation 110 with forming a spacer layer 212 in the contact hole 211 and over the dummy gate material layer 210. As shown, the spacer layer 212 is formed to overlay the exposed surface 207 and extends along sidewalls of the contact hole 211. In some embodiments, the spacer layer 212 may be formed using a deposition process (e.g., a chemical vapor deposition process). More particularly, the spacer layer 212 includes one or more dielectric material. For example, the spacer layer 212 is formed of silicon nitride (SiN), silicon carbonitride (SiCN), silicon oxycarbonitirde (SiOCN), aluminum oxide (AlO), and/or aluminum oxynitride (AlON).

Figure 2F:
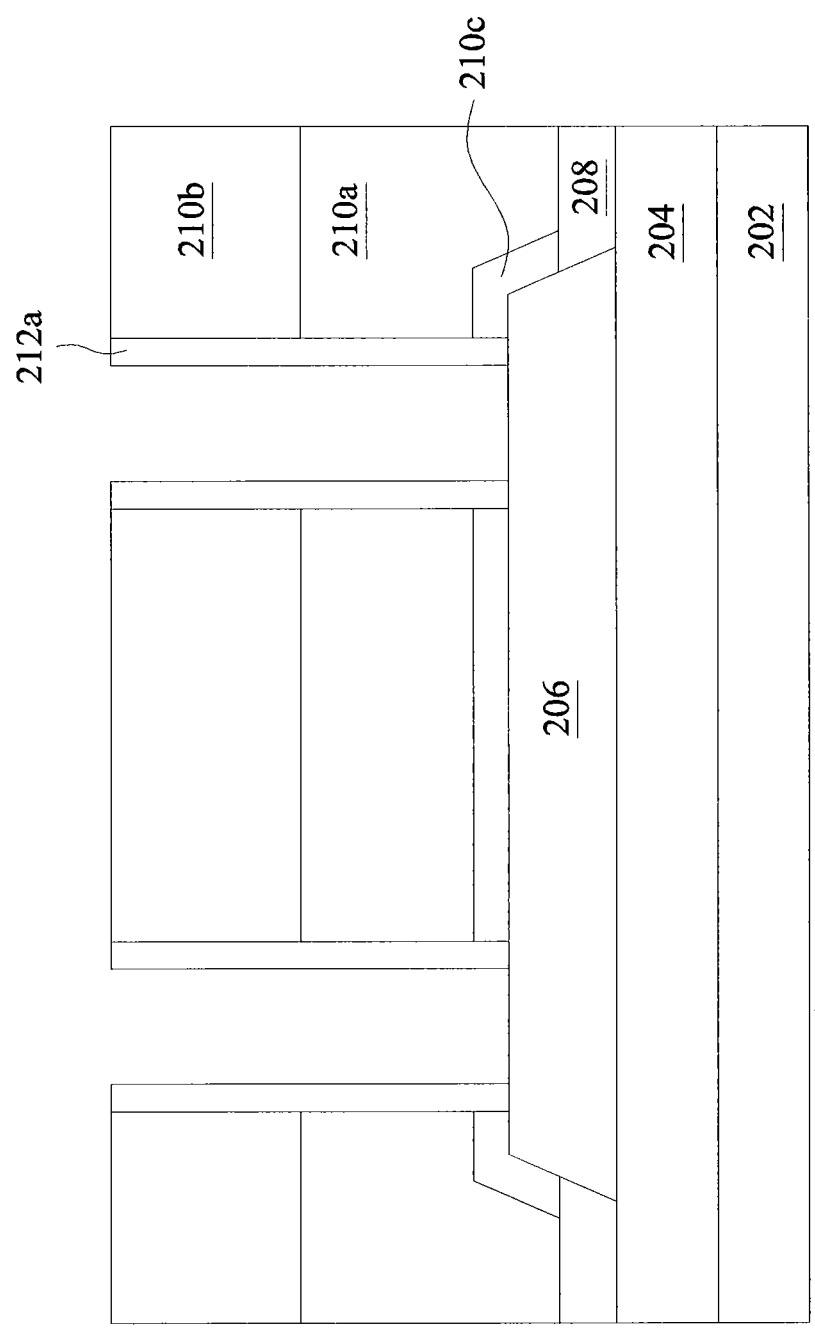

Referring now to FIGS. 1 and 2F, the method 100 proceeds to operation 112 with selectively etching the spacer layer 212. In the illustrated embodiment of FIG. 2F, the selectively etching may result in removing the portion of the spacer layer that overlays surface 207 of the fin structure 206 and leaving the portion 212a of the spacer layer 212 covering the sidewalls of the contact hole 211. In some embodiments, the selectively etching may include an anisotropic etching process such as, for example, a dry etching process (e.g., a reactive ion etching process).

Figure 2G:
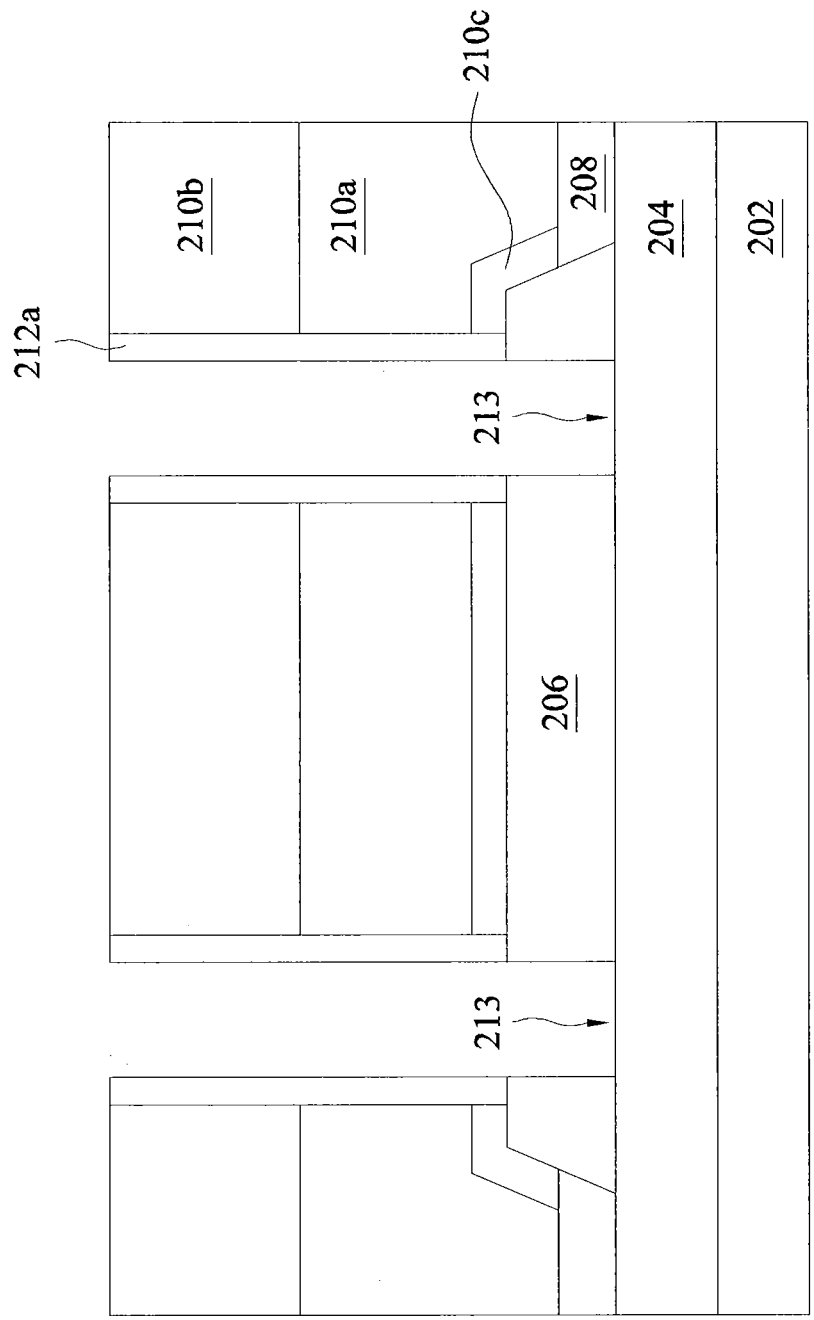
Figure 2H:
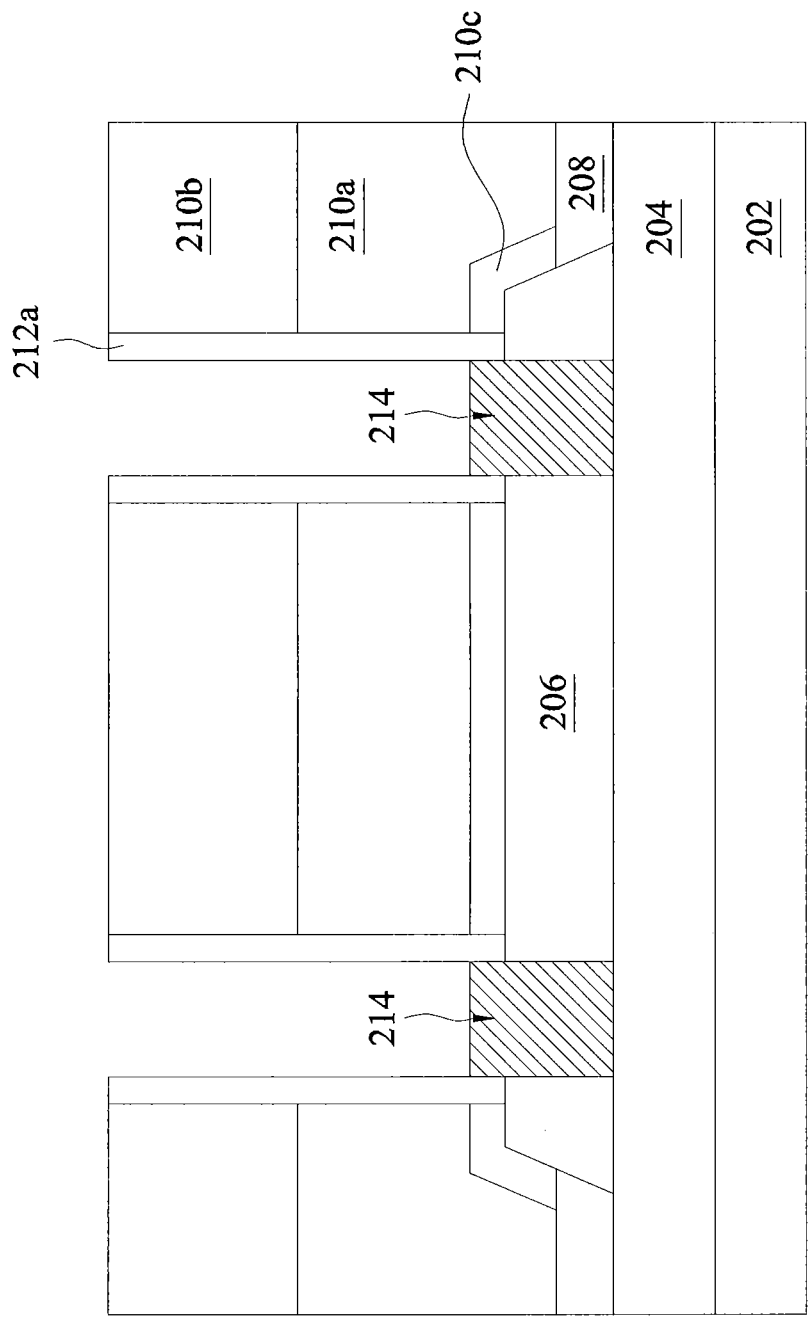

The method 100 continues to operation 114 with forming a source/drain (S/D) feature 214 (or S/D features), as illustrated in FIGS. 2G and 2H. As shown in FIG. 2G, the S/D feature 214 is formed by removing a portion of the fin structure 206 to form a trench 213. Then, as shown in FIG. 2H, an epitaxial process is used to form S/D feature 214 in the trench 213 by growing a doped semiconductor material within trench. Such an epitaxial process involves growing a semiconductor structure on a semiconductor substrate. During the epitaxial process, the regrown semiconductor material may be doped in-situ, for example, with a B11 species of dopant. Other species of dopants may be used as well. The regrown portion may be made of silicon (Si), germanium (Ge), silicon germanium (SiGe), silicon germanium carbon (SiGeC) or a III-V compound semiconductor material. The doped region may also be made of silicon phosphorous (SiP), silicon carbon (SiC), silicon phosphorous carbon (SiPC), or combination thereof. In the present embodiment, the S/D feature 214 is formed before forming a dummy gate (which will be described in the following discussion).

Figure 2I:
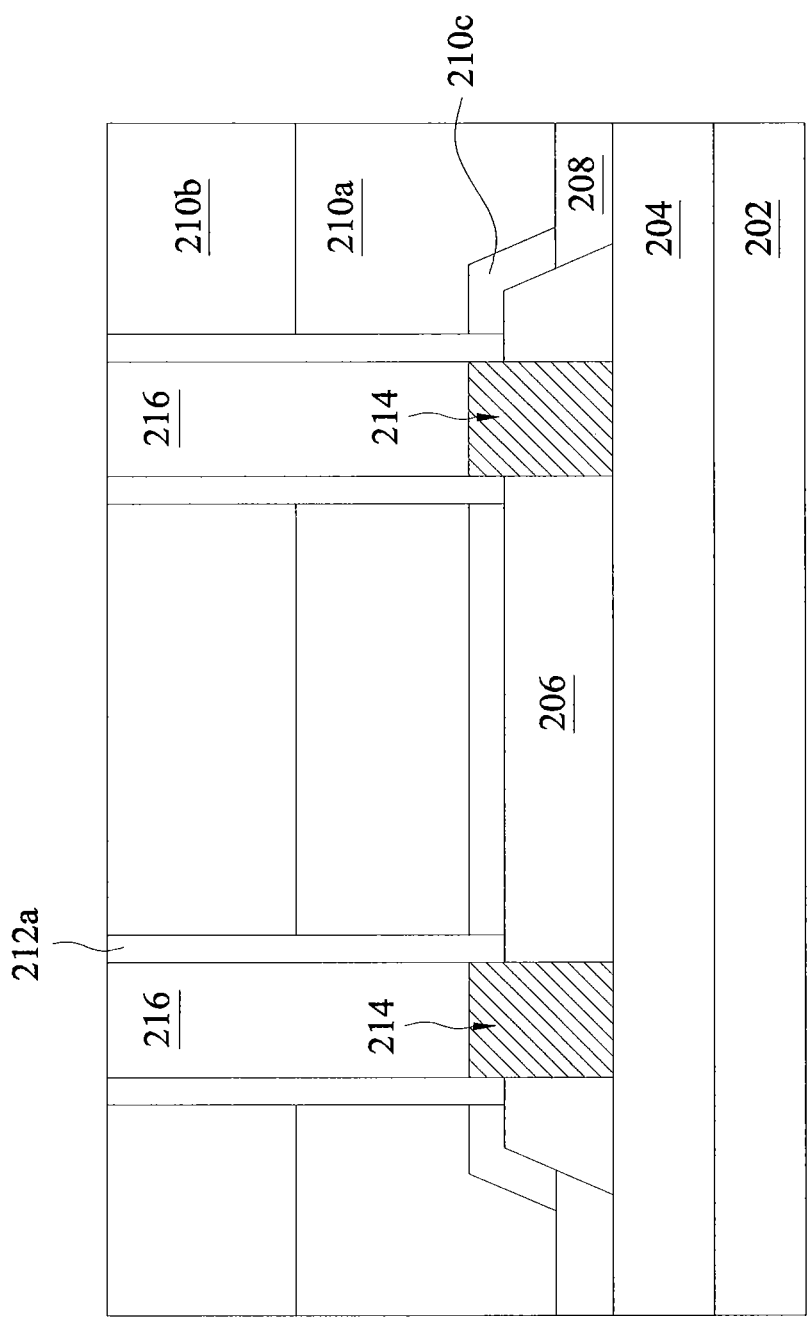

With reference to FIG. 2I, after the formation of the S/D feature 214, the method 100 continues to operation 116 with forming a S/D contact 216 that is electrically connected to the S/D feature 214. In some embodiments, the S/D contact 216 is configured to electrically connect the S/D feature to a conductive structure such as, for example, an interconnect structure. The S/D contact 216 itself may include a variety of conductive features, such as contacts/vias for vertical connections. The various conductive features 216 may implement various conductive materials including copper, tungsten and silicide. In an embodiment, tungsten is used to form tungsten plug in the contact holes.

Figure 2J:
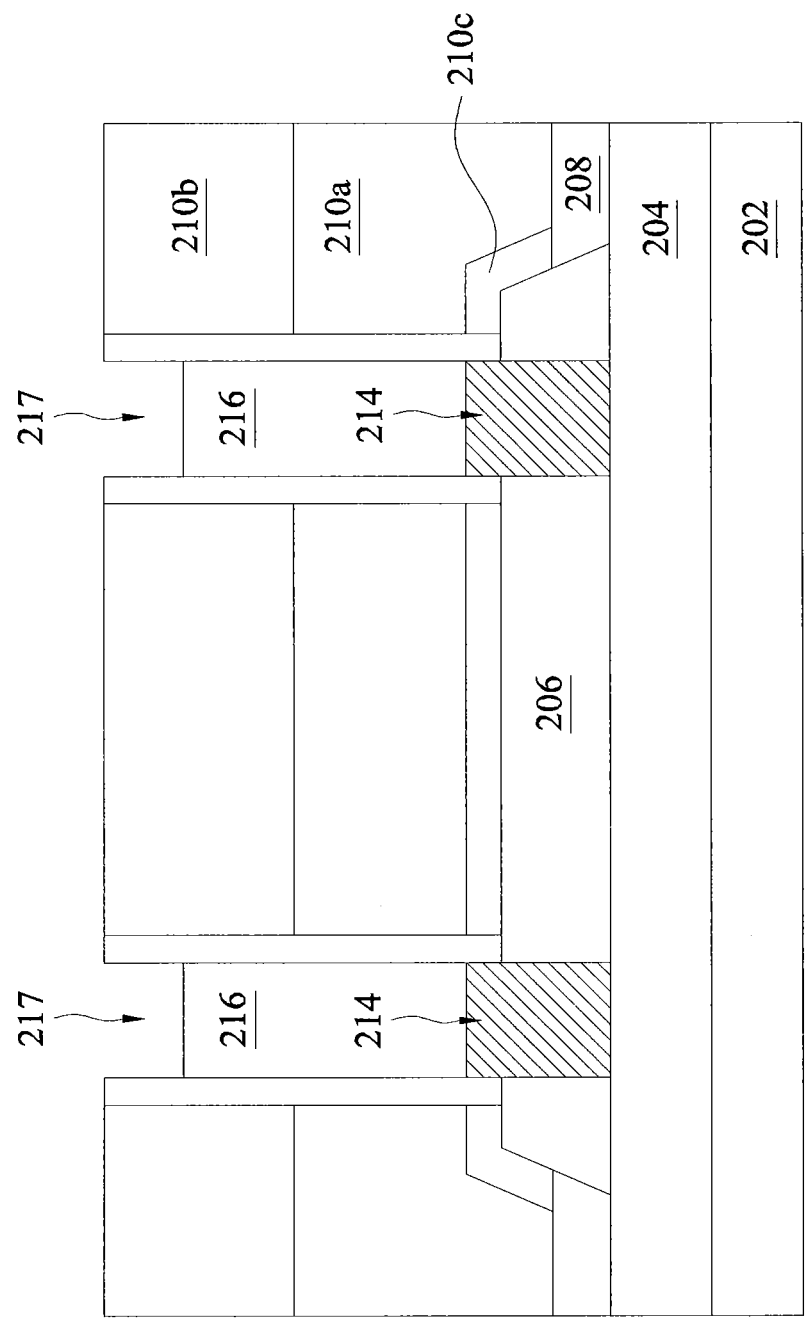
Figure 2K:
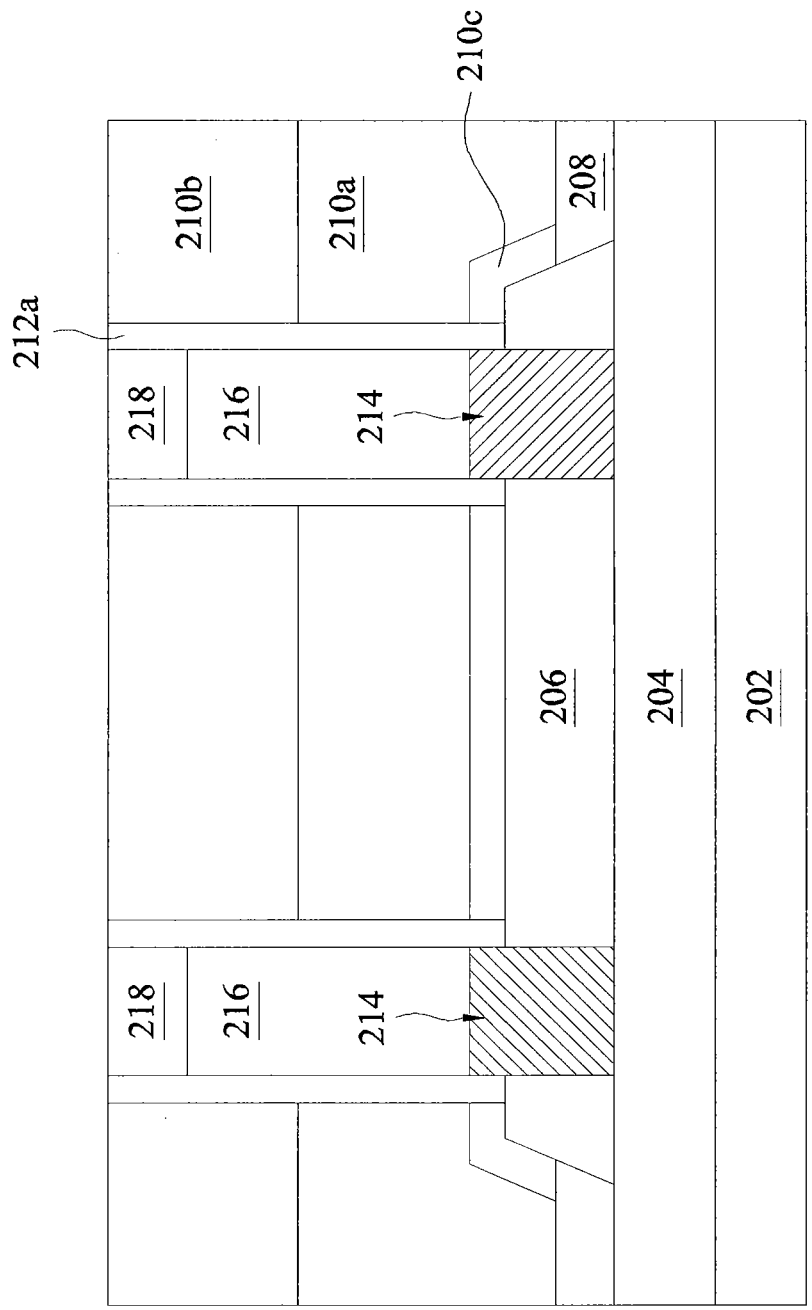

As illustrated in FIGS. 2J and 2K, the method 100 continues to operation 118 with recessing a top portion of the S/D contact 216 and forming a hardmask layer 218 over the recessed S/D contact 216. As shown in FIG. 2J, the recession of the S/D contact 216 may include using a dry and/or a wet etching process to form a trench 217. Then, as shown in FIG. 2K, a hardmask layer 218 is then formed within the trench 217 by a deposition process. In some particular embodiments, the hardmask layer 218 may be formed of silicon nitride (SiN), silicon carbonitride (SiCN), silicon oxycarbonitirde (SiOCN), aluminum oxide (AlO), and/or aluminum oxynitride (AlON).

Figure 2L:
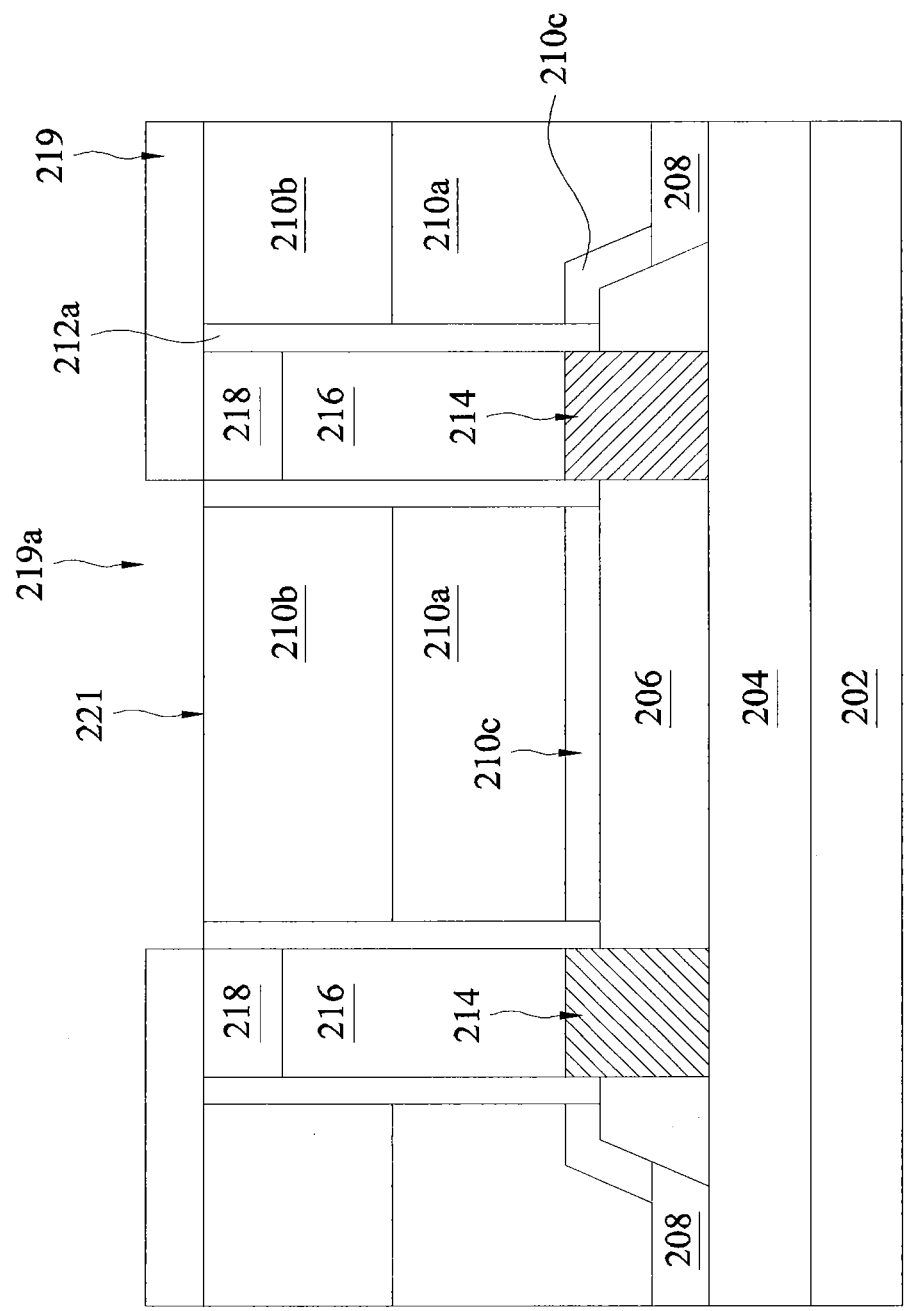

Referring now to FIGS. 1 and 2L, the method 100 continues to operation 120 with forming a patterned mask layer 219 over dummy gate material layer 210. As shown, patterned mask layer 219 defines an opening 219a that exposes a portion of dummy gate material layer 210. For purposes of simplicity and clarity, the exposed portion of dummy gate material layer 210 is referred to as dummy gate 221. As discussed below, dummy gate 221 includes the portion of dummy gate material layer 210 that undergoes a gate replacement process.

Figure 2M:
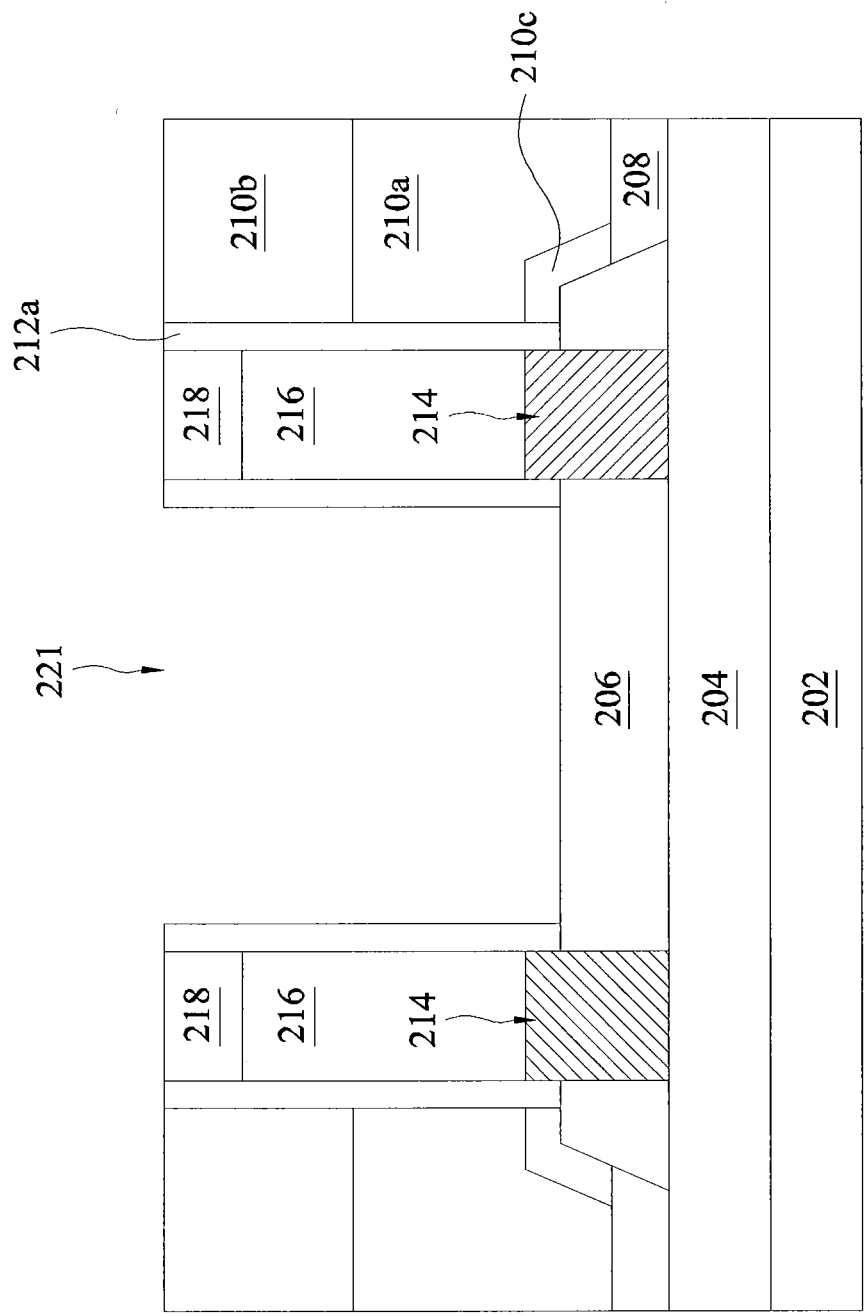
Figure 2N:
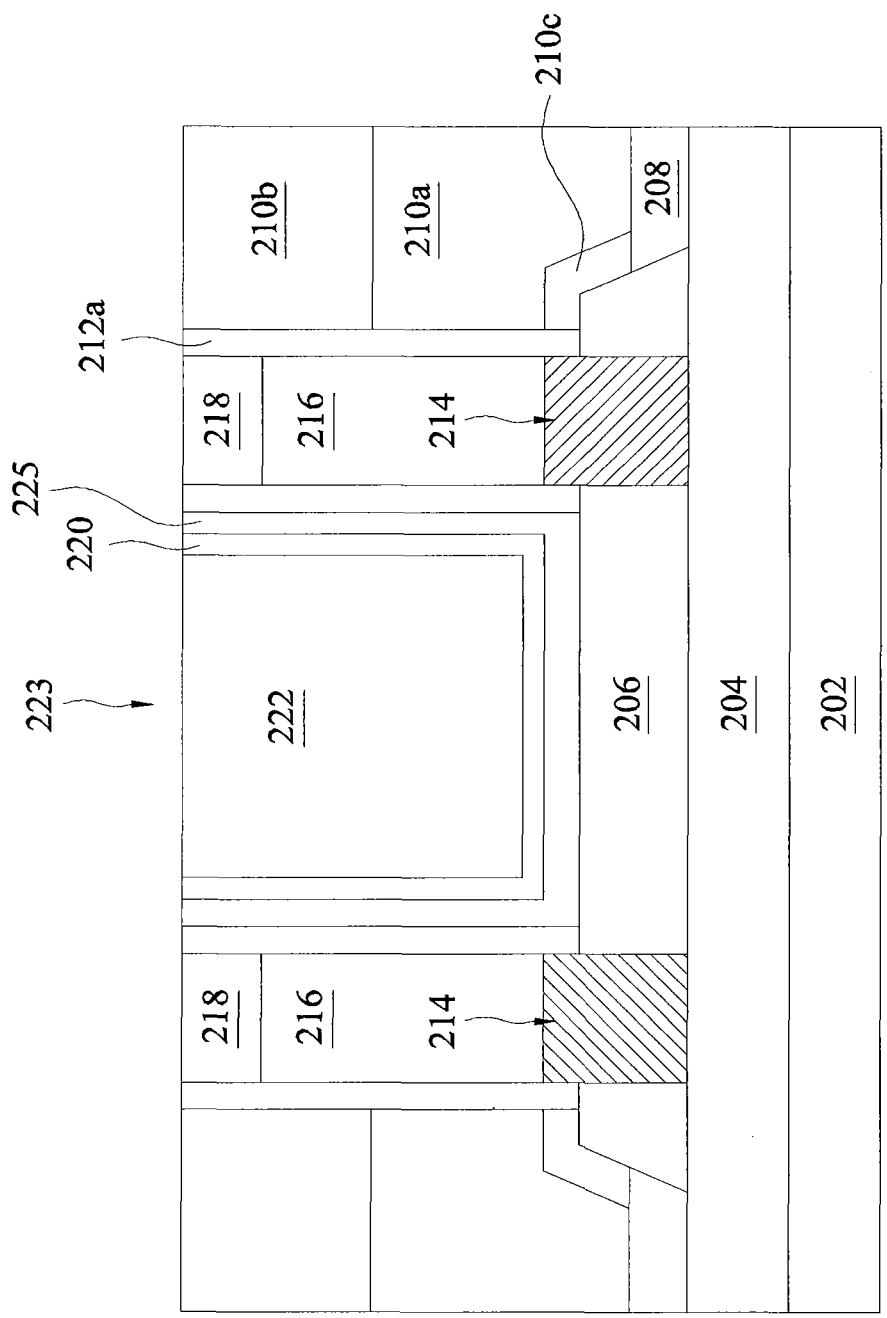

The method 100 continues to operation 122 with replacing the dummy gate 221 with a gate feature 223 as illustrated in FIGS. 2M and 2N. Referring first to FIG. 2M, replacing dummy gate 221 may include one or more of the following processes: removing the layer 210b of the dummy gate 221, subsequently removing the layer 210a and 210c thereby exposing a portion of the top surface (and sidewalls) of the fin structure 206 and forming a hole feature 221 (or trench). After the hole feature 221 is formed, referring to FIG. 2N, replacing the dummy gate 221 may further includes depositing a gate dielectric layer 220 in the hole 221 and thus covering the exposed top surface and sidewalls of the fin structure 206, and then forming a gate electrode/gate conductive layer 222 over the gate dielectric layer 220. As such, the gate feature 223 may include the gate dielectric layer 220 and the gate conductive layer 222. In some embodiments, the gate dielectric layer 220 may include a high-k dielectric material; the gate conductive layer 222 may include metal. In some alternative embodiments, the gate conductive layer 222 may include multiple layers, such as a capping layer, a work function metal layer, a blocking layer and a filling metal layer (such as aluminum or tungsten). In furtherance of the embodiment, the capping layer includes titanium nitride, tantalum nitride, or other suitable material, formed by a proper deposition technique such as ALD. The blocking layer includes titanium nitride, tantalum nitride, or other suitable material, formed by a proper deposition technique such as ALD. The work functional metal layer includes a conductive layer of metal or metal alloy with proper work function such that the corresponding FET is enhanced for its device performance. The work function (WF) metal layer is different for a pFET and an nFET, respectively referred to as an n-type WF metal and a p-type WF metal. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

Referring still to FIG. 2N, additionally or alternatively, the gate feature 223 may further include an interfacial layer 225, such as silicon oxide, interposed between the fin structure 206 and the (high-k) dielectric material 220. The interfacial layer 225 is a portion of the gate dielectric layer. The various gate material layers are filled in the hole feature 221 (as illustrated in FIG. 2M) by deposition, such as CVD, PVD, plating, ALD or other suitable techniques. The high-k dielectric layer 294 includes HfO2, or alternatively metal nitrides, metal silicates or other metal oxides. The high k dielectric layer 220 is formed by a suitable process such as ALD. Other methods to form the high k dielectric material layer including but not limited to MOCVD, PVD, UV-Ozone Oxidation and/or MBE may be used while remaining within the scope of the present disclosure.

Figure 2O:
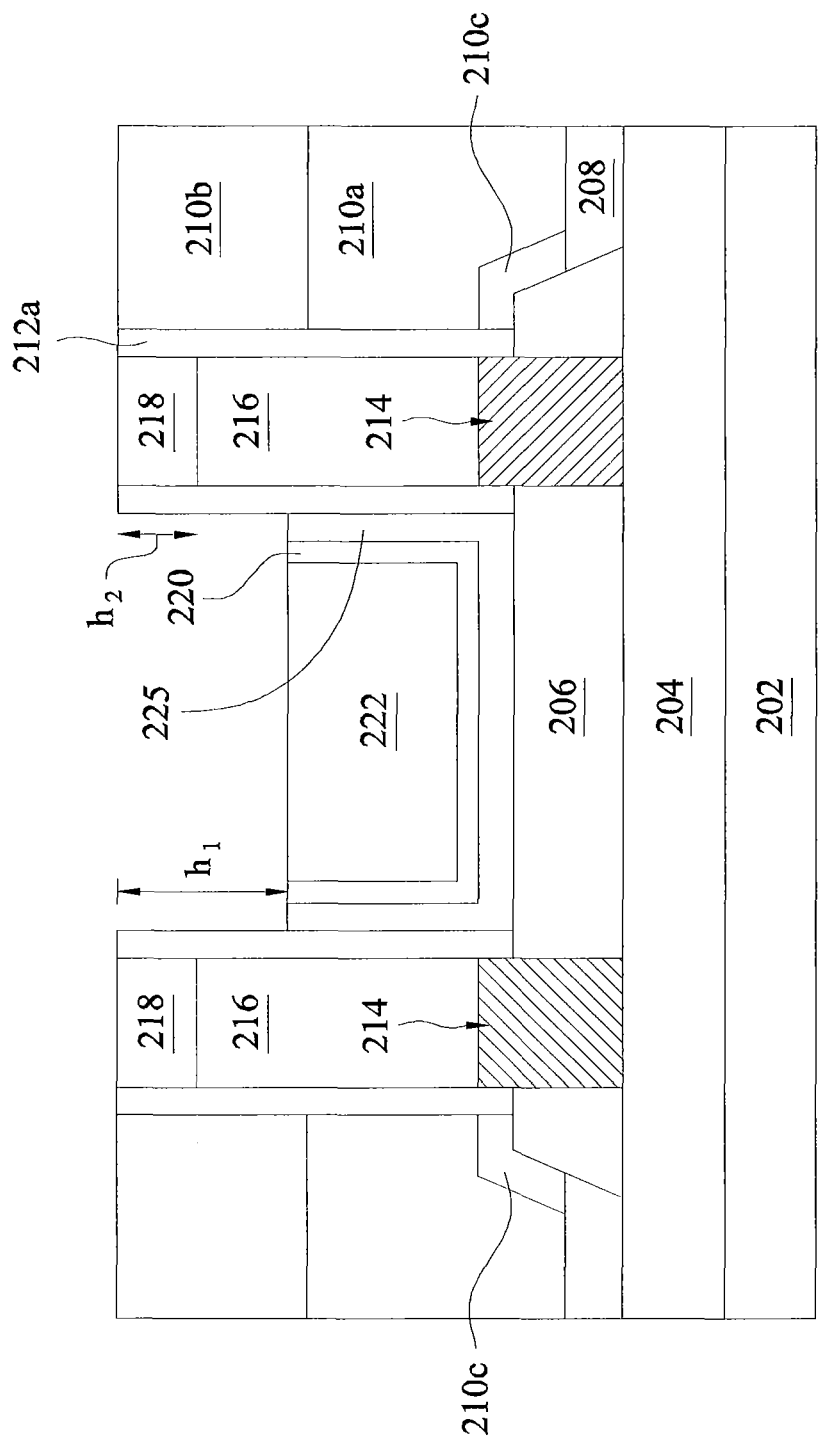

Referring now to FIGS. 1 and 2O, the method 100 continues to operation 124 with recessing the gate feature 223. The recession of the gate feature 223 may include selectively etching a top portion of the interfacial layer 225, the gate dielectric layer 220, and the gate conductive layer 222. Such a selectively etching may include a dry etching process. In a particular embodiment of FIG. 2O, the portion of the gate feature 223 being recessed may have a height, "h1", which is higher than a height of the hardmask layer 218, "h2". That is, the recessed gate feature 223 has a top surface that is lower than the hardmask layer 218.

Figure 2P:
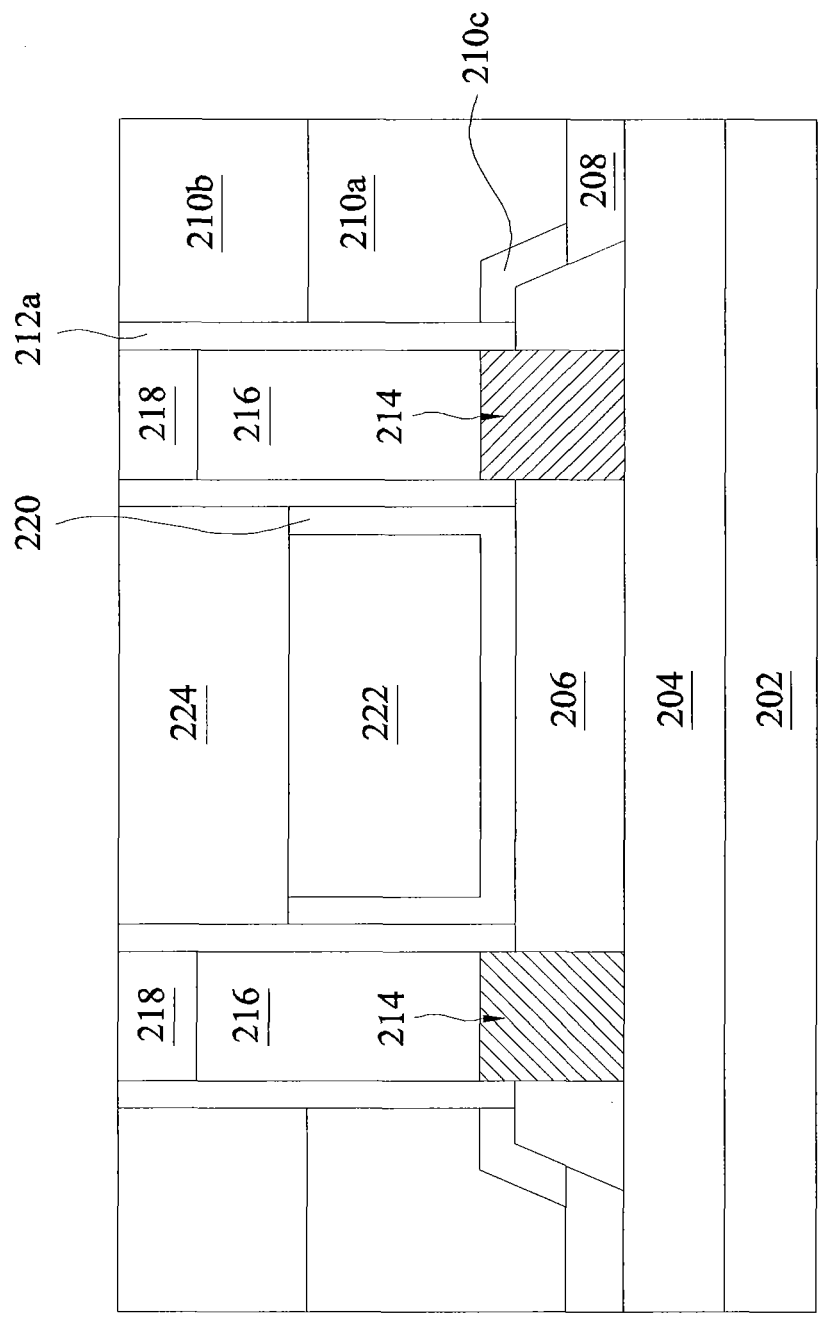
Figure 2Q:
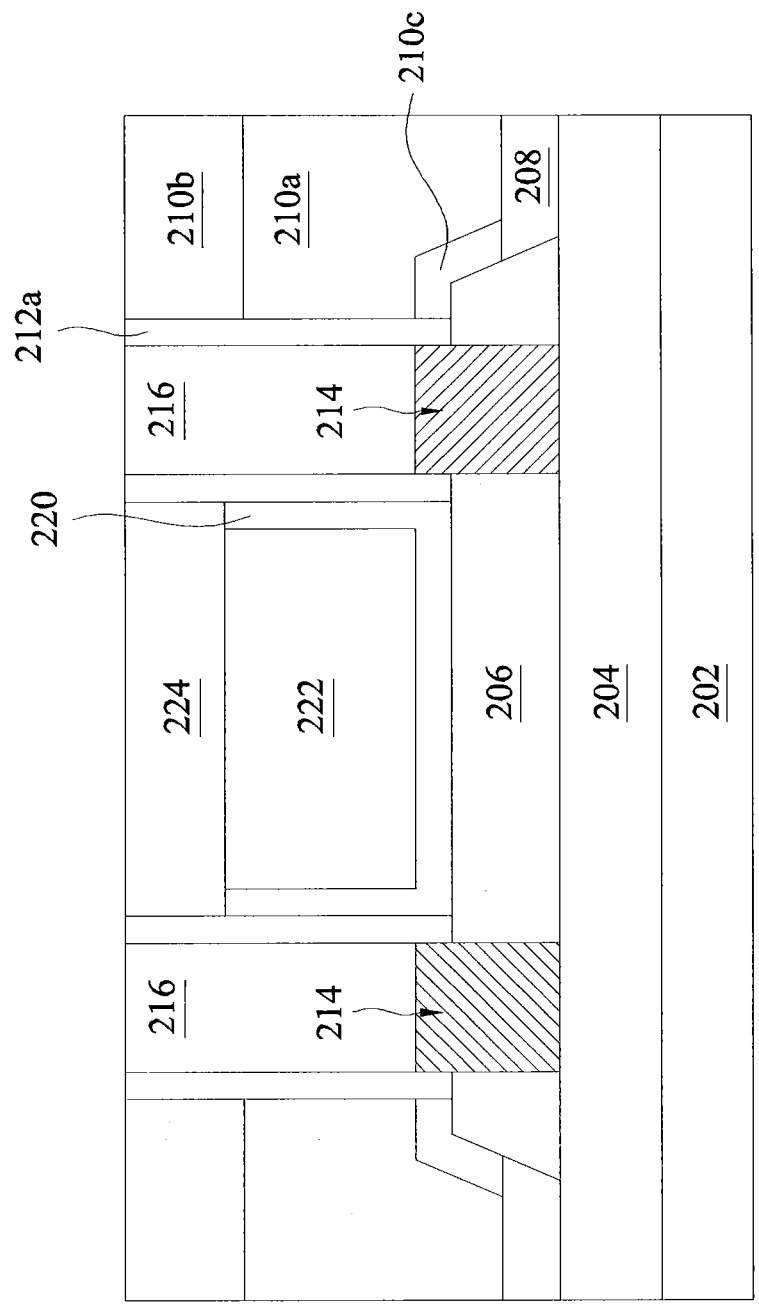
Figure 2R:
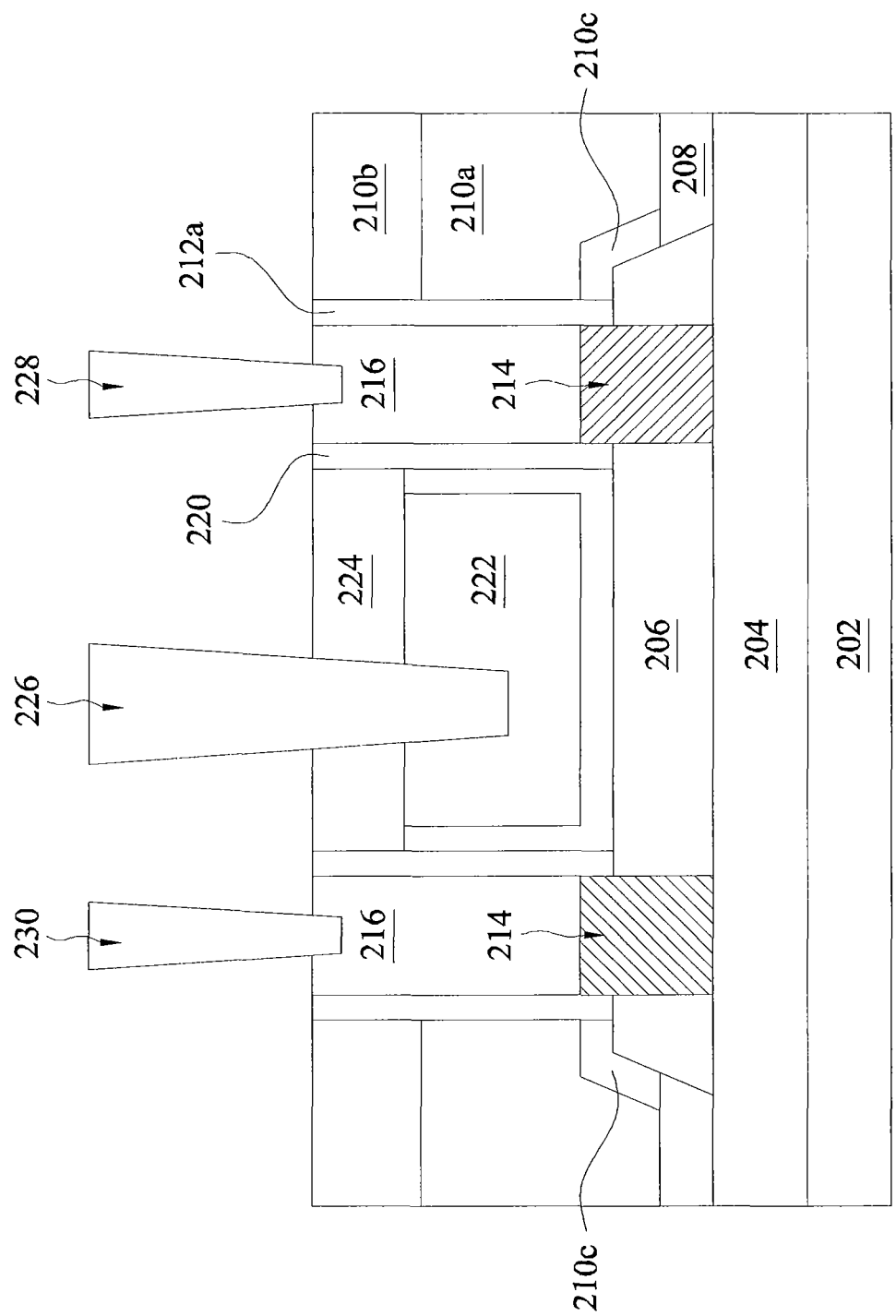
Figure 3:
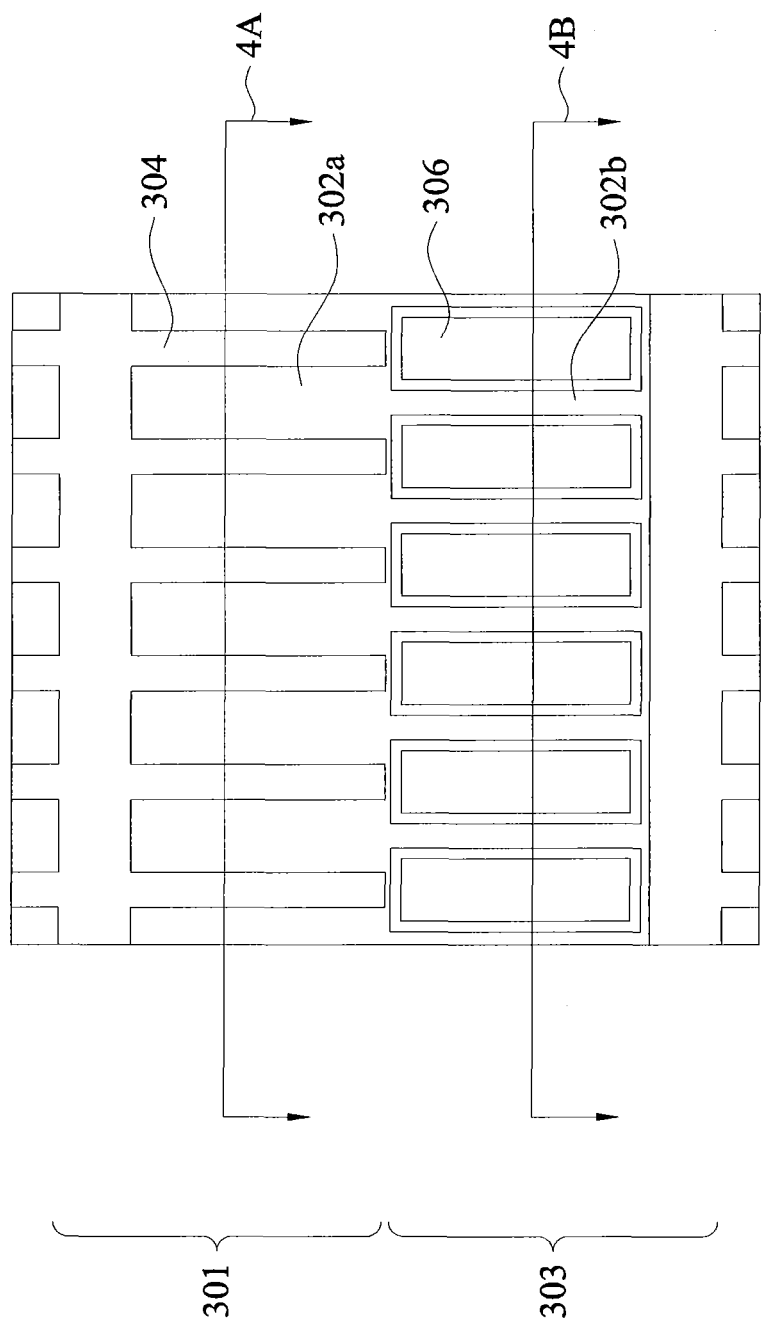
FIG. 3 is a top view of a semiconductor device that is fabricated according to principles described herein.
Figure 4A:
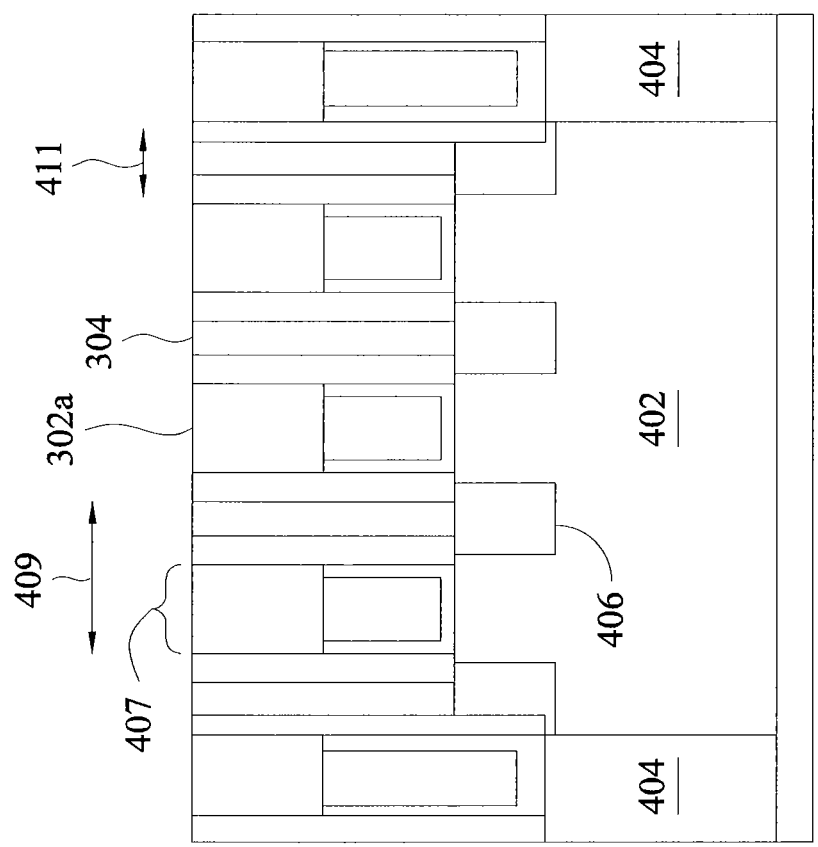
FIGS. 4A and 4B are cross-sectional views of the semiconductor device fabricated according to principles described herein.
Figure 4B:
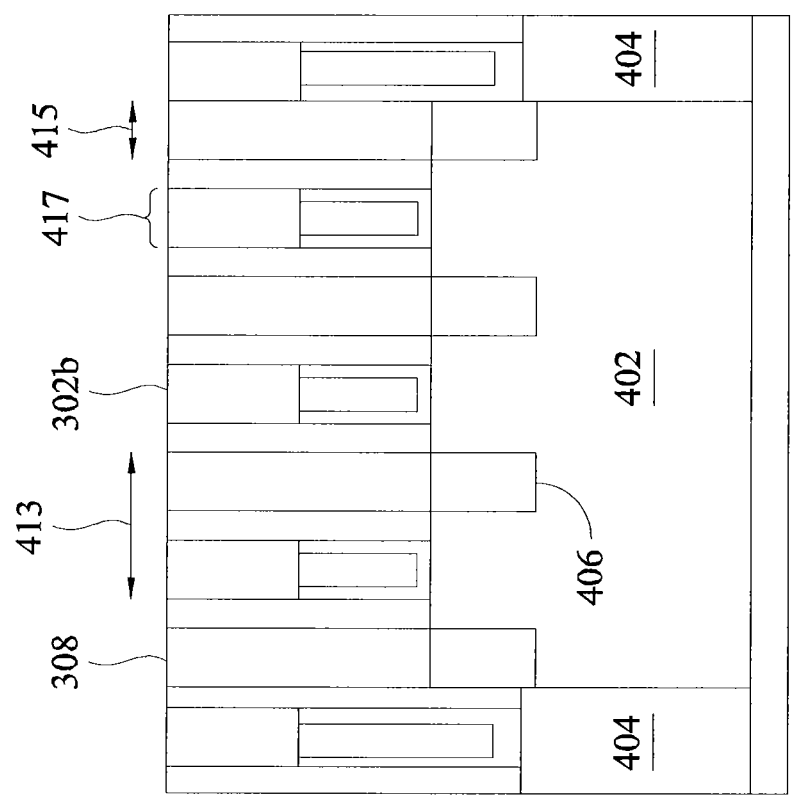

Referring to FIG. 2P, method 100 then continues to operation 126 with forming a dielectric layer 224 over the recessed gate feature 223 by a deposition process. The dielectric layer 224 may be formed of a material that is selected from the group consisting of: silicon nitride (SiN), silicon carbonitride (SiCN), silicon oxycarbonitirde (SiOCN), aluminum oxide (AlO), and/or aluminum oxynitride (AlON). In some embodiments, after the formation of the dielectric layer 224, a CMP process may be used to planarize a top surface of the dielectric layer 224 and further used to remove the hardmask layer 218 as illustrated in FIG. 2Q. The removal of the hardmask layer 218 may lead to exposing a top surface of the S/D contact 216. As such, a conductive plug 228/230, as illustrated in FIG. 2R, may be formed to electrically connect to the S/D contact 216 and the S/D feature 214. Further in FIG. 2R, a conductive plug 226 may be formed to electrically connect the gate conductive layer 222.

The embodiments of the present disclosure provide a variety of advantages in terms of forming a S/D contact on a S/D feature of a FinFET. Conventionally, a formation of FinFET device generally includes: forming a dummy gate over a fin structure, wrapping sidewalls of the dummy gate with a spacer layer, forming a S/D feature next to the spacer layer, overlaying the dummy gate and the S/D feature with an ILD layer, etching through the ILD layer to expose the S/D feature, and thus forming a S/D contact through the ILD layer to electrically connect the S/D feature. In such a process, the S/D feature is formed before the etching process to expose the S/D feature. Since the etching process generally includes an etching process using high-energy plasma, damage to the S/D feature is caused due to such etching processes with high-energy plasma. In contrast, the embodiments of the present disclosure provide methods for fabricating a FinFET device that includes forming an S/D contact before forming a gate feature. More particularly, an etching process may be present to form a contact hole that is later to be used to form an S/D feature but, in various embodiments of the present disclosure, an epitaxial process and then a filling process with a conductive material (e.g., metal) that are used to form the S/D feature and the S/D contact through the contact hole are generally not subjected to causing damage to the S/D contact or even the fin structure. As such, the above-identified issue that commonly occurs in conventional approaches may be advantageously circumvented.

In an embodiment, a method to fabricate a semiconductor device includes forming a semiconductor fin on a substrate; forming a dummy gate material layer over the semiconductor fin; forming a contact hole in the dummy gate material layer; forming a source/drain feature in the contact hole; forming a contact feature on the source/drain feature within the contact hole; and replacing a dummy gate that is formed of the dummy gate material layer with a metal gate.

In another embodiment, a method to fabricate a semiconductor device includes forming a semiconductor fin on a substrate; forming a dummy gate material layer over the semiconductor fin; forming a contact hole in the dummy gate material layer; forming a source/drain feature in the contact hole; forming a contact feature on the source/drain feature within the contact hole; removing a portion of the dummy gate material layer to form a trench; and forming a gate electrode material layer within the trench.

Yet in another embodiment, a method to fabricate a semiconductor device includes forming a semiconductor fin on a substrate; forming a dummy gate material layer over the semiconductor fin; forming a contact hole in the dummy gate material layer to expose a portion of the semiconductor fin; forming a source/drain feature on the exposed portion of the semiconductor fin; forming a contact feature on the source/drain feature; removing a portion of the dummy gate material layer to form a trench; and forming a metal gate electrode within the trench.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin on a substrate;
   forming a dummy gate material layer over the semiconductor fin;
   forming a contact hole in the dummy gate material layer;
   forming a source/drain feature in the contact hole;
   forming a contact feature on the source/drain feature within the contact hole; and
   replacing a dummy gate that is formed of the dummy gate material layer with a metal gate.

2. The method of claim 1, wherein the dummy gate material layer includes a poly-semiconductor layer and a dielectric layer formed over the poly-semiconductor layer.

3. The method of claim 1, wherein forming the contact hole in the dummy gate material layer includes:
   etching the dummy gate material layer thereby exposing the semiconductor fin through the contact hole;
   depositing a spacer layer over the semiconductor fin and sidewalls of the contact hole; and
   etching a portion of the spacer layer that overlays the semiconductor fin.

4. The method of claim 3, wherein the spacer layer is formed of a material that is selected from the group consisting of silicon nitride and silicon carbonitride.

5. The method of claim 1, wherein forming the source/drain feature in the contact hole includes epitaxially growing the source/drain feature on the semiconductor fin.

6. The method of claim 1, wherein forming the contact feature on the source/drain feature within the contact hole includes:
   depositing a conductive material layer over the source/drain feature thereby filling the contact hole with the conductive material layer;
   recessing the conductive material layer; and
   forming a dielectric layer over the recessed conductive material layer.

7. The method of claim 1, further comprising forming a patterned material layer over the dummy gate material layer, the patterned material layer having an opening that exposes a portion of the dummy gate material layer, and wherein replacing the dummy gate that is formed of the dummy gate material layer with the metal gate includes removing the exposed portion of the dummy gate material layer.

8. The method of claim 1, wherein replacing the dummy gate with the metal gate includes:
   removing the dummy gate from the semiconductor fin;
   forming a gate dielectric layer over the semiconductor fin; and
   forming a metal layer over the gate dielectric layer.

9. The method of claim 1, further comprising:
   recessing the metal gate;
   forming a dielectric layer over the recessed metal gate; and
   planarizing the dielectric layer thereby exposing the contact feature in the contact hole.

10. A method comprising:
    forming a semiconductor fin on a substrate;
    forming a dummy gate material layer over the semiconductor fin;
    forming a contact hole in the dummy gate material layer;
    forming a source/drain feature in the contact hole;
    forming a contact feature on the source/drain feature within the contact hole;
    removing a portion of the dummy gate material layer to form a trench; and
    forming a gate electrode material layer within the trench.

11. The method of claim 10, wherein the dummy gate material layer includes a poly-semiconductor layer and a dielectric layer formed over the poly-semiconductor layer.

12. The method of claim 10, wherein forming the contact hole in the dummy gate material layer includes:
    etching the dummy gate material layer thereby exposing the semiconductor fin through the contact hole; and
    depositing a spacer layer over the semiconductor fin and sidewalls of the contact hole.

13. The method of claim 12, wherein the spacer layer is formed of a material that is selected from the group consisting of silicon nitride and silicon carbonitride.

14. The method of claim 10, wherein forming the source/drain feature in the contact hole includes epitaxially growing the source/drain feature on the semiconductor fin.

15. The method of claim 10, wherein forming the contact feature on the source/drain feature within the contact hole includes:
    depositing a conductive material layer over the source/drain feature within the contact hole;
    recessing the conductive material layer; and
    forming a dielectric layer over the recessed conductive material layer.

16. The method of claim 10, wherein forming the gate electrode material layer within the trench includes forming a metal material layer within the trench.

17. The method of claim 16, wherein removing the portion of the dummy gate material layer to form the trench includes removing the portion of the dummy gate material layer to thereby expose a portion of the fin structure within the trench.

18. The method of claim 17, further comprising forming a gate dielectric layer on the exposed portion of the fin structure;
    recessing the gate electrode material layer;
    forming a dielectric layer over the recessed gate electrode material layer; and
    planarizing the dielectric layer thereby exposing the contact feature.

19. A method, comprising:
  forming a semiconductor fin on a substrate;
  forming a dummy gate material layer over the semiconductor fin;
  forming a contact hole in the dummy gate material layer to expose a portion of the semiconductor fin;
  forming a source/drain feature on the exposed portion of the semiconductor fin;
  forming a contact feature on the source/drain feature;
  removing a portion of the dummy gate material layer to form a trench; and
  forming a metal gate electrode within the trench.

20. The method of claim 19, further comprising forming a spacer layer within the trench, and
  wherein forming the contact hole in the dummy gate material layer to expose the portion of the semiconductor fin includes removing a portion of the spacer layer.

* * * * *